(12) United States Patent
Assaderaghi et al.

(10) Patent No.: US 6,432,754 B1
(45) Date of Patent: Aug. 13, 2002

(54) DOUBLE SOI DEVICE WITH RECESS ETCH AND EPITAXY

(75) Inventors: Fariborz Assaderaghi, Mahopac; Tze-Chiang Chen, Yorktown Heights; K. Paul Muller, Wappingers Falls, all of NY (US); Edward Joseph Nowak, Essex Junction, VT (US); Devendra Kumar Sadana, Pleasantville; Ghavam G. Shahidi, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/788,979

(22) Filed: Feb. 20, 2001

(51) Int. Cl.⁷ .............................................. H01L 21/00
(52) U.S. Cl. ...................................... 438/149; 257/347
(58) Field of Search ............................... 438/149–156, 438/164, 300; 257/347, 280, 281

(56) References Cited

U.S. PATENT DOCUMENTS

| | | | |
|---|---|---|---|
| 3,853,633 A | 12/1974 | Armstrong | 148/1.5 |
| 4,222,062 A | 9/1980 | Trotter et al. | 357/45 |
| 4,393,578 A | 7/1983 | Cady et al. | 29/576 B |
| 4,839,707 A | 6/1989 | Shields | 357/23.7 |
| 4,951,123 A | 8/1990 | Lee et al. | 357/81 |
| 5,166,765 A | 11/1992 | Lee et al. | 257/345 |
| 5,273,921 A * | 12/1993 | Neudeck et al. | 437/41 |
| 5,285,352 A | 2/1994 | Pastore et al. | 361/707 |
| 5,376,578 A | 12/1994 | Hsu et al. | 437/56 |
| 5,482,871 A * | 1/1996 | Pollack | 437/21 |
| 5,726,459 A * | 3/1998 | Hsu et al. | 257/55 |
| 5,780,912 A | 7/1998 | Burr et al. | 257/408 |
| 6,008,126 A | 12/1999 | Leedy | 438/667 |
| 6,057,555 A | 5/2000 | Reedy et al. | 257/9 |
| 6,074,920 A | 6/2000 | Houston | 438/289 |
| 6,166,412 A * | 12/2000 | Kim et al. | 257/366 |

OTHER PUBLICATIONS

Skotnicki, T., et al., "Heavily doped and extremely shallow junctions on insulator by SONCTION (SilicON Cut–off juncTION) process", Electron Devices Meeting, 1999. IEDM Technical Digest. International, pp. 513–516, (Dec. 5–8, 1999).

Yan, R.H., et al., "High performance 0.1 mu m room temperature Si MOSFETs", VLSI Technology, 1992. Digest of Technical Papers. 1992 Symposium on, pp. 86–87, (Jun. 2–4, 1992).

* cited by examiner

Primary Examiner—Hoai Ho
Assistant Examiner—Quoc Hoang
(74) Attorney, Agent, or Firm—Scully, Scott, Murphy & Presser; H. Daniel Schnurmann

(57) ABSTRACT

The present invention provides various methods for forming a ground-plane SOI device which comprises at least a field effect transistor formed on a top Si-containing surface of a silicon-on-insulator (SOI) wafer; and an oxide region present beneath the field effect transistor, located in an area between source and drain regions which are formed in said SOI wafer, said oxide region is butted against shallow extensions formed in said SOI wafer, and is laterally adjacent to said source and drain regions.

24 Claims, 8 Drawing Sheets

DOUBLE SOI DEVICE WITH RECESS ETCH AND EPITAXY

FIELD OF THE INVENTION

The present invention relates to semiconductor devices, and more particularly to a ground-plane SOI device that includes an oxide layer under the device channel region, located in an area between the deep source/drain regions. This oxide layer is butted against the shallow extensions (therefore, no shallow extension area junction capacitance exists) and is laterally adjacent to the deep source/drain regions (therefore, reduced source/drain perimeter junction capacitance is obtained). Additionally, the present invention also provides various methods of forming the aforementioned ground-plane SOI device in which the short channel effects typically present in such devices have been substantially eliminated.

BACKGROUND OF THE INVENTION

In semiconductor processing, SOI technology is becoming increasingly more important since it permits the formation of high-speed integrated circuits. In SOI technology, a relatively thin layer of semiconducting material, namely monocrystalline Si, overlays a layer of insulating material, e.g., a buried oxide region. This relatively thin layer of semiconducting material is generally the area wherein active devices such as field effect transistors (FETs) are formed in the SOI wafer. Devices formed on SOI offer many advantages over their bulk Si counterparts including higher performance, absence of latch-up, higher packing density and lower voltage applications.

Despite the advantages obtained using SOI technology, SOI technology suffers from short channel effects which are also present in bulk Si technology. As is known to those skilled in the art short channel effects tend to degrade the electronic integrity of the device and lead to unacceptable device leakage current known in the art as 'off-current'. Short channel effects are more pronounced in very large scale integration (VSLI) devices wherein the channel length is less than 1 $\mu$m.

In view of the short channel effect problem mentioned above with prior art SOI devices, there is a continued need for developing a new and improved SOI device which substantially eliminates the short channel effects.

SUMMARY OF THE INVENTION

One object of the present invention is to provide a ground-plane device that has no shallow extension junction capacitance while having reduced deep source/drain perimeter junction capacitance.

Another object of the present invention is to provide a ground-plane device in which the advantages of both ground-plane and SOI devices are achieved in a single device.

A further object of the present invention is to provide a ground-plane device which allows for a highly doped ground plane to be present without dopants diffusing up into the channel region of the device. As is known to those skilled in the art, the channel region is typically located beneath the field effect transistor, i.e., beneath the gate dielectric and gate conductor.

These and other objects and advantages are achieved in the present invention by providing a ground-plane SOI device having an oxide region present beneath the channel region, located in an area between the source/drain regions. This oxide region, which is butted against the shallow extensions, and is laterally adjacent to the deep source/drain regions, provides a device having no shallow extension area junction capacitance and reduced deep source/drain perimeter junction capacitance.

One aspect of the present invention relates to various methods of fabricating a ground-plane device having the above-mentioned characteristics. Specifically, a first method of the present invention comprises the steps of:

(a) forming a back oxide layer in a Si-containing layer of a silicon-on-insulator (SOI) wafer so as to separate said Si-containing layer into a top Si-containing layer and a bottom Si-containing layer, said SOI wafer having a buried oxide layer formed on a Si substrate and said Si-containing layer formed on said buried oxide layer;

(b) forming a ground-plane doping region into a top portion of said bottom Si-containing layer;

(c) forming a gate region on a portion of said top Si-containing layer, said gate region including a gate dielectric formed on said top Si-containing layer, a gate conductor formed on said gate dielectric and a hard mask formed on said gate conductor;

(d) forming halo and source/drain extension regions in said top Si-containing layer;

(e) forming spacers on a portion of said gate dielectric so as to protect vertical sidewalls of said gate conductor and said hard mask;

(f) removing all exposed portions of said top Si-containing layer so as to expose a portion of said back oxide layer underlying said top Si-containing layer;

(g) removing said exposed portions of said back oxide layer;

(h) forming source and drain regions in said bottom Si-containing layer; and (i) forming salicide regions on all exposed silicon surfaces.

A second method of the present invention comprises the steps of:

(a) forming a back oxide layer in a Si-containing layer of a silicon-on-insulator (SOI) wafer so as to separate said Si-containing layer into a top Si-containing layer and a bottom Si-containing layer, said SOI wafer having a buried oxide layer formed on a Si substrate and said Si-containing layer formed on said buried oxide layer;

(b) forming a ground-plane doping region into a top portion of said bottom Si-containing layer;

(c) forming a gate region on a portion of said top Si-containing layer, said gate region including a gate dielectric formed on said top Si-containing layer, a gate conductor formed on said gate dielectric and a hard mask formed on said gate conductor;

(d) forming halo and source/drain extension regions in said top Si-containing layer;

(e) forming spacers on a portion of said gate dielectric so as to protect vertical sidewalls of said gate conductor and said hard mask;

(f) forming a contact to the bottom Si-containing layer by conducting a self-aligned ion implant step into regions next to the gate region and the spacers;

(g) forming source and drain regions in said bottom Si-containing layer; and (h) saliciding all exposed silicon surfaces.

A third method of the present invention comprises the steps of:

(a) forming a damascene oxide layer on a-surface of a Si-containing layer of an SOI wafer, said SOI wafer including a Si substrate, a buried oxide layer and said Si-containing layer;

(b) providing an opening in said damascene oxide layer stopping on said Si-containing layer;

(c) forming a local back oxide region in said Si-containing layer through said opening;

(d) forming a local ground-plane region beneath said local back oxide region;

(e) forming a gate region including at least a gate dielectric and a gate conductor in said opening;

(f) removing said damascene oxide layer;

(g) forming source and drain regions in said Si-containing layer of said SOI wafer;

(h) forming extension and halo implant regions in said Si-containing layer above said local back oxide region;

(i) forming a conformal liner about said gate region; and (j) salicidinig all exposed silicon surfaces.

Another aspect of the present invention relates to a ground-plane SOI device which comprises:

at least a field effect transistor formed on a top Si-containing surface of a silicon-on-insulator (SOI) wafer; and an oxide region present beneath the field effect transistor, which is located in an area between source and drain regions that are formed in said SOI wafer, said oxide region is butted against shallow extensions formed in said SOI wafer, and is laterally adjacent to said source and drain regions.

DETAILED DESCRIPTION OF THE INVENTION

Figure 1:
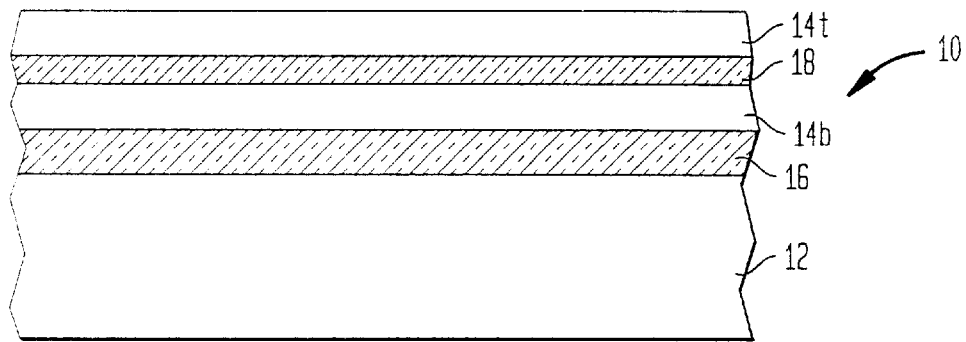
FIGS. 1–10 show the processing steps used in the first method of the present invention.

The present invention will now be described in more detail by referring to the various drawings that accompany the present application. It is noted that in the accompanying drawings like reference numerals are used for describing like and corresponding elements.

Reference is first made to FIGS. 1–10 which illustrate the basic processing steps employed in the first method of the present invention. Specifically, FIG. 1 shows an initial structure of the present invention after forming back oxide layer 18 into Si-containing layer 14 of SOI wafer 10. As shown, back oxide layer 18 is formed in the Si-containing layer so as to separate layer 14 into a top Si-containing layer 14t and bottom Si-containing layer 14b. The SOI wafer further includes buried oxide layer 16 which is formed over Si substrate 12. The SOI wafer minus back oxide layer 18 is formed utilizing techniques that are well known to those skilled in the art including: SIMOX (Separation by implantation of oxygen) or bonding. Of these various techniques, it is preferred that SOI wafer 10 (minus back oxide layer 18) be formed by a SIMOX process wherein a buried oxide having a thickness of from about 20 to about 25 nm is formed utilizing a low-energy (on the order of about 60 eV or below) $O_2$ implant, followed by a high-temperature (on the order of about 1300° C. or above) anneal.

Back oxide layer is formed in the Si-containing layer by utilizing a second low-energy $O_2$ implant process, followed by a high-temperature annealing process. Specifically, the second low-energy $O_2$ implant is carried out utilizing an implant energy of from about 10 keV to about 50 keV and an annealing temperature of about 1320° C. or above.

Figure 2:
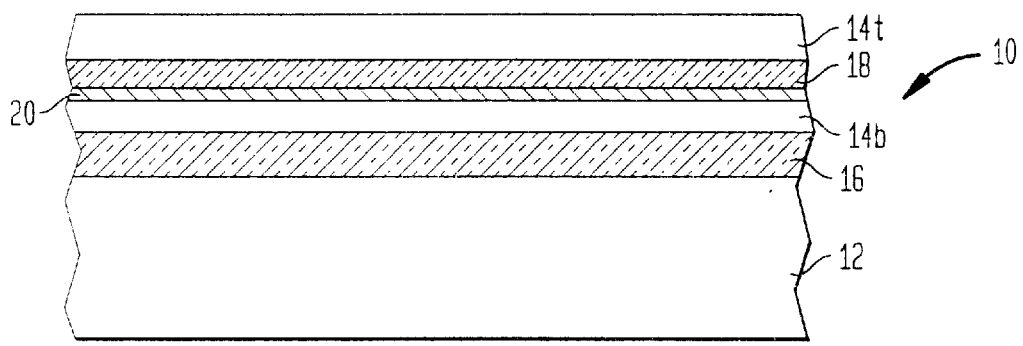

Next, as shown in FIG. 2, ground-plane doping region 20 is formed into a top portion of bottom Si-containing layer 14b. Specifically, the ground-plane region is formed in the present invention by a conventional ion implantation process wherein a dopant of a first conductivity type (either n-type or p-type) is implanted into a top portion of bottom Si-containing layer 14b. The type of dopant used in this implant step depends on the type of device to be fabricated. When a pFET (field effect transistor) is the desired device to be fabricated, a n-type dopant is employed. On the other hand, when a nFET is the desired device, a p-type dopant is employed. The conditions for this implant step vary depending on the type of dopant employed. Typically, when a nFET is to be formed, a p-type dopant having a concentration of 1E19 atoms/cm$^3$ will be employed.

Figure 3:
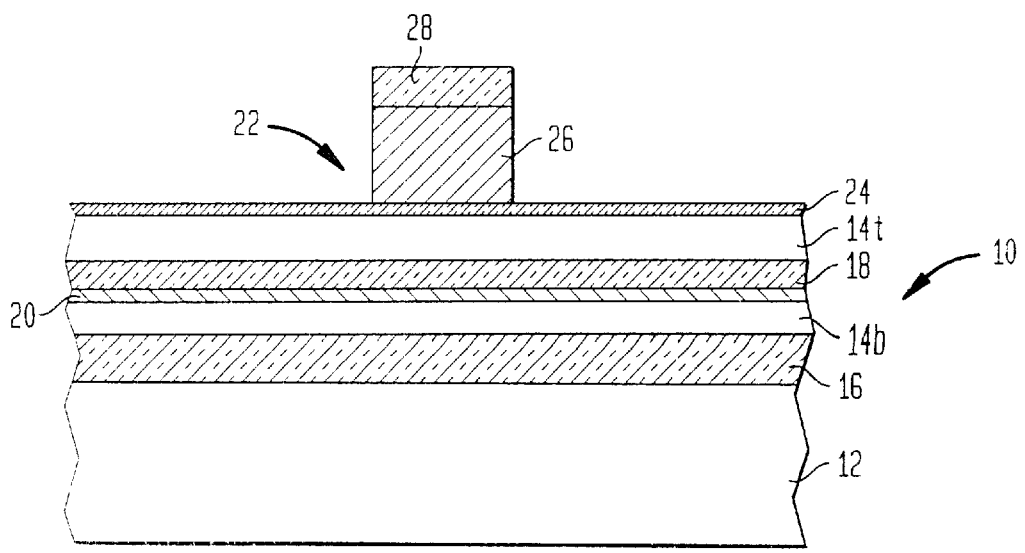

FIG. 3 shows the next step of the present invention wherein gate region 22 (including gate dielectric 24, gate conductor 26 and hard mask 28) is formed on a portion of the top Si-containing layer of the SOI wafer. Specifically, gate region 22 is formed by first forming a layer of gate dielectric material such as an oxide (e.g., $SiO_2$, $Al_2O_3$, $HfO_2$ and $ZrO_2$), nitride or oxynitride on the surface of top Si-containing layer 14t.

The gate dielectric may be formed by utilizing a conventional deposition process such as chemical vapor deposition (CVD), plasma-assisted CVD, atomic layer chemical vapor deposition (ALCVD), sputtering or chemical solution deposition, or alternatively, the gate dielectric may be formed by a conventional thermal growing process. The thickness of the gate dielectric may vary, but typically, the gate dielectric has a thickness of from about 0.6 to about 2.0 nm.

Following the above, gate conductor 26 is formed on the surface of gate dielectric 24 utilizing a conventional deposition process including, but not limited to: CVD, plasma-assisted CVD, sputtering, and other like deposition processes. The gate conductor may be composed of any conductive material including, but not limited to: W, W/Ni, doped polysilicon, and combinations thereof. When doped polysilicon is employed as the gate conductor, the doped polysilicon may be formed by a conventional in-situ doping deposition process, or alternatively deposition, followed by ion implantation may be employed. The thickness of the gate conductor may vary and is not critical to the present invention. Typically, however, the gate conductor has a thickness of from about 100 to about 150 nm.

Next, hard mask 28 which may be composed of an oxide (e.g., $SiO_2$), a nitride (e.g., $Si_3N_4$) or carbide (e.g., SiC) is formed on the surface of gate conductor 26 utilizing a conventional deposition process such as CVD. The thickness of the hard mask may vary and is also not critical to the present invention.

After forming the hard mask on the gate conductor, conventional lithography and etching such as reactive-ion etching (RIE) are employed in forming gate region 22. The etching step employed in the present invention stops at the gate insulator level. It is noted that an optional reoxidation process utilizing conventional conditions well known to those skilled in the art may follow the etching step. Moreover, it is noted that this etching step of the present invention may remove portions of the hard mask and gate conductor, as well as portions of the gate dielectric.

If a pFET is to be formed, thin spacers (not shown) are formed about gate region 22 so as to protect the exposed vertical sidewalls of the gate conductor and hard mask and so as to space out the p-extension implant region. The optional thin spacers are composed of any conventional insulator such as an oxide, a nitride or an oxynitride and they are formed utilizing a conventional deposition process and etching.

Figure 4:
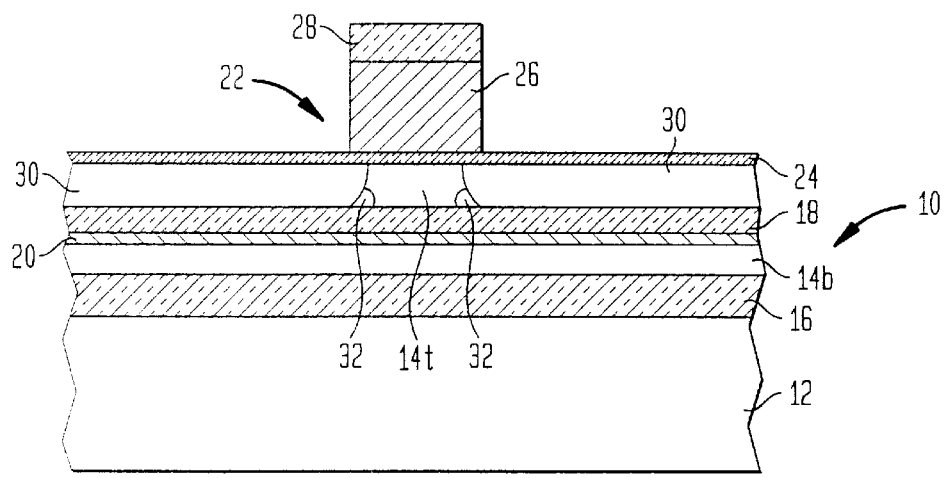

In accordance with next step of the present invention, extension implants and halo implants are then performed utilizing conventional ion implantation processes well known to those skilled in the art. The conditions of these implants may vary depending on the type of device to be formed. Typically when a nFET is to be fabricated, the extension implant utilizes a n-type dopant having a concentration of about 1E20 atoms/cm$^3$, while p-type dopants, such as boron, having a concentration of about 1E18 atoms/cm$^3$ are used during the halo implant. FIG. 4 shows the structure after conducting these implant steps wherein reference numeral 30 denotes the extension implant regions and reference numeral 32 denotes the halo implant regions.

Figure 5:
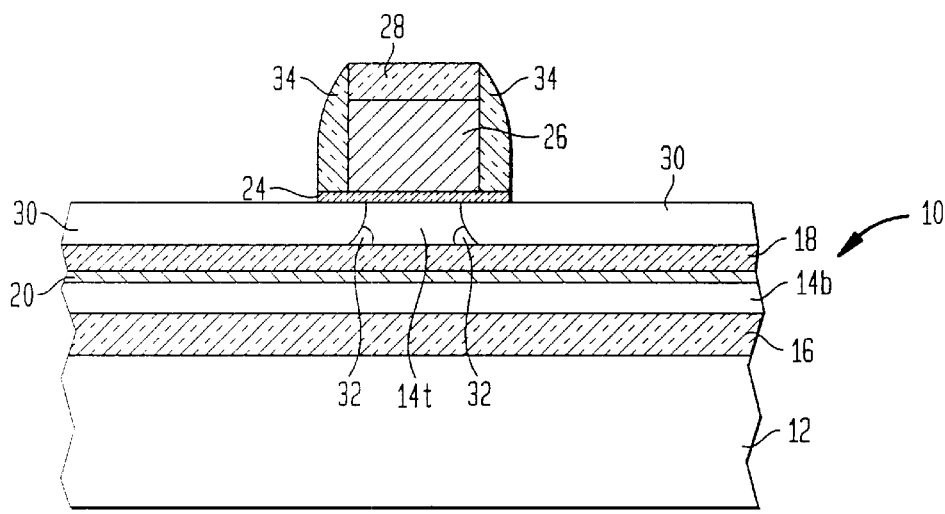

After conducting the above-mentioned extension and halo implants, spacers 34 are formed adjacent to the gate stack, e.g., layers 26 and 28, so as to protect any exposed vertical sidewalls of the gate conductor and the hard mask, and to create an offset to the edge of extension region 30, See FIG. 5. The spacers, which may be composed of a conventional dielectric material such as an oxide, nitride or oxynitride, are formed by a conventional deposition process and etching. It should be noted that if optional spacers are present, spacers 34 are formed on the optional spacers and spacers 34 and the optional spacers may be composed of the same or different insulator material.

Figure 6:
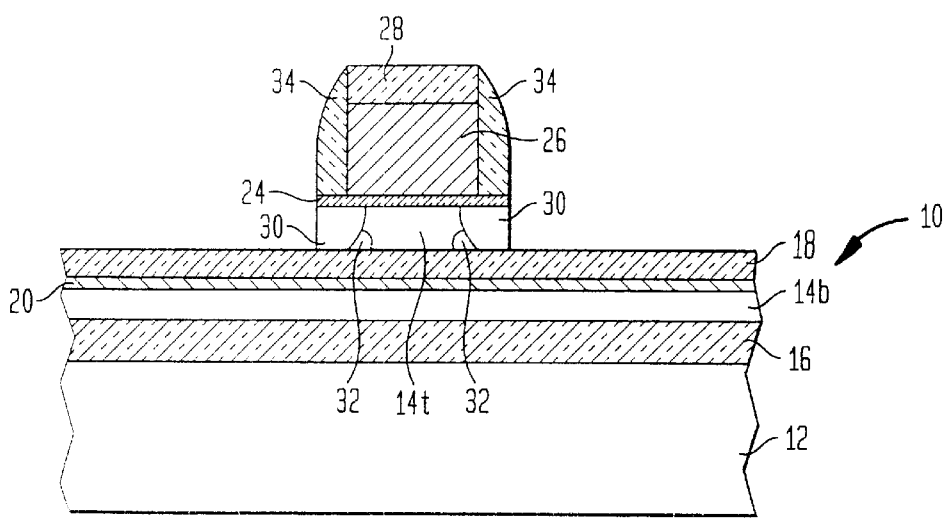

FIG. 6 shows the structure that is obtained after removing exposed portions of the top Si-containing layer 14t of SOI wafer 10 so as to expose portions of back oxide layer 18. Specifically, this processing step of the present invention removes any top Si-containing layer 14t in the source/drain regions (to be subsequently formed) that is not covered by gate region 22 and spacers 34 stopping on the underlying back oxide layer 18. In accordance with the present invention, this removal process is achieved by utilizing any conventional etching process such as RIE (reactive-ion etching) that is anisotropic and selective to the spacer and hard mask materials.

Figure 7:
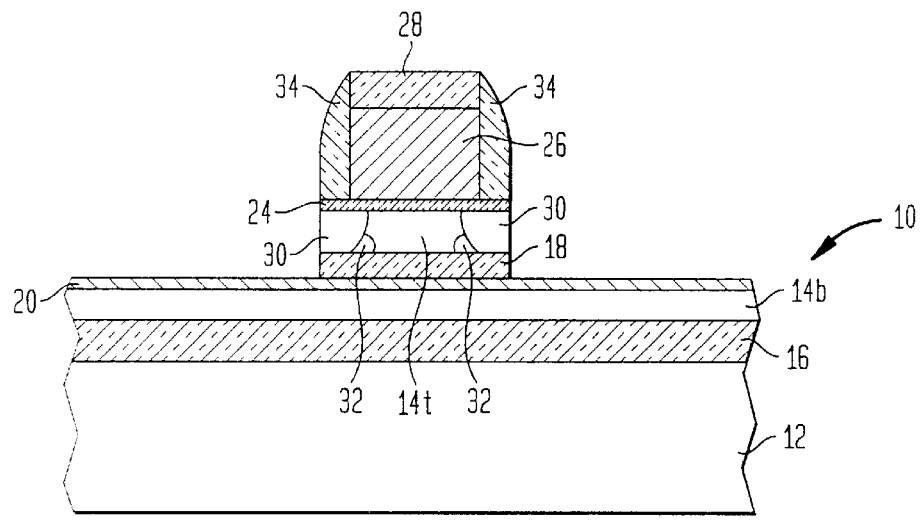

Next, the exposed portions of back oxide layer 18 are removed from the structure shown in FIG. 6 so as to provide the structure illustrated in FIG. 7. Specifically, the exposed portions of the back oxide layer are removed by utilizing any conventional etching process such as RIE that is anisotropic and selective to nitride and silicon. This step of the present invention exposes portions of bottom Si-containing layer 14b. In some embodiments of the present invention, see FIG. 11, this step of the present invention removes the hard mask as well as the exposed portions of the back oxide layer. The removal of both the hard mask and exposed portions of the back oxide layer occurs when the hard mask is composed of an oxide.

Figure 8:
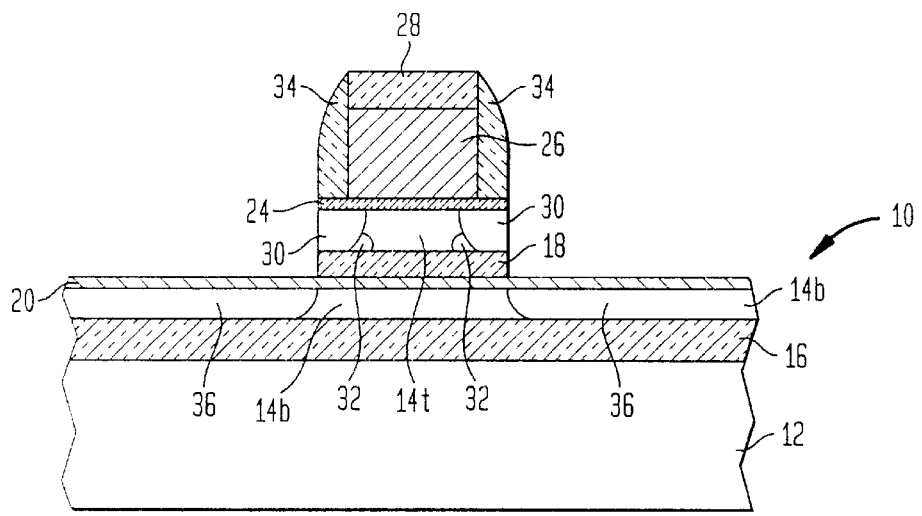

FIG. 8 shows the structure after deep source/drain regions 36 are formed within the exposed layer of bottom Si-containing layer 14b. The source/drain regions are formed utilizing conventional processing steps well known to those skilled in the art, including ion implantation and annealing. Although various conditions for ion implantation and annealing may be used in forming the source/drain regions, the following conditions are typically used when a nFET is to be formed: n-dopant concentration of about 1E20 atoms/cm$^3$ and annealing at about 1000° C. for about 5 seconds.

Figure 9:
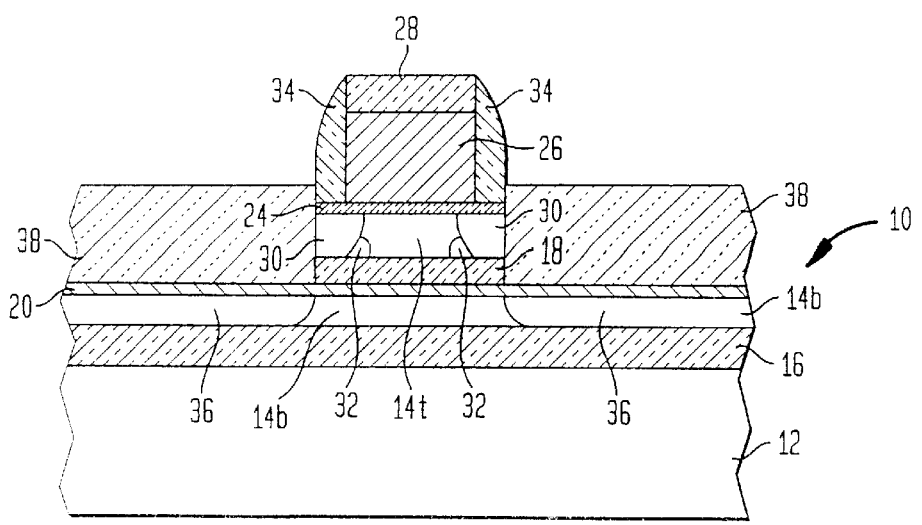
Figure 10:
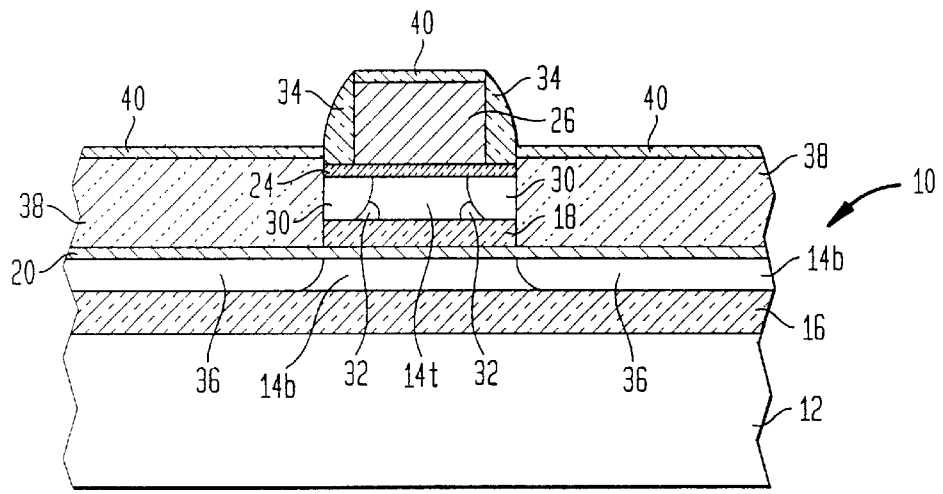

FIG. 9 shows the structure after forming selective epitaxially grown Si layer 38 on the surface of the exposed bottom Si-containing layer, while FIG. 10 shows the structure after removing the hard mask 28 and subjecting the exposed selective epitaxially grown Si layer and the gate conductor to a conventional salicidation (i.e., self-aligned silicidation) process so as to form salicide regions 40. Typically, in the present invention, salicing occurs at a temperature of about 700° C. or greater, for a time period of about 60 seconds or less.

Figure 11:
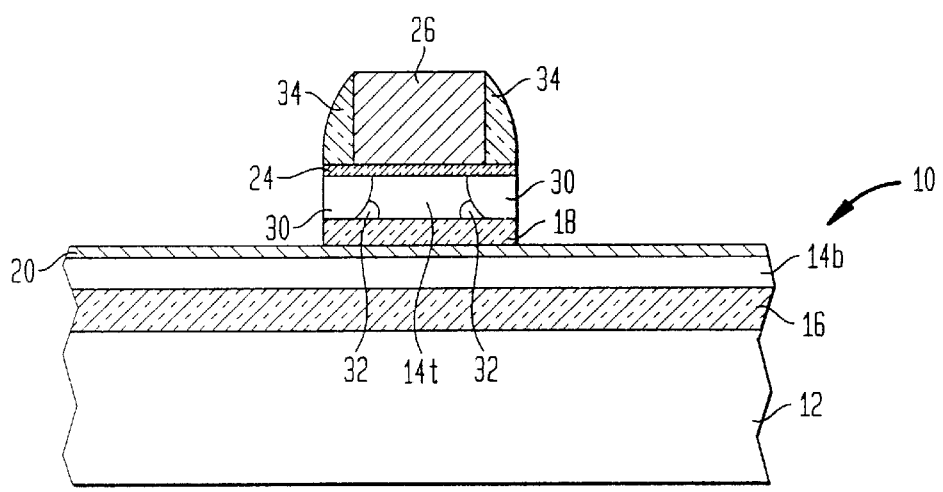
FIGS. 11–13 show an alternative embodiment of the first method of the present invention.

It should be noted that although FIG. 10 shows a raised source/drain structure, the present invention also contemplates planar structures in which selective epitaxially grown Si layer 38 is not formed on the structure. The formation of the planar structure will be now described in greater detail by referring to FIGS. 11–13. Specifically, the planar structure is formed utilizing the same processing steps leading up to the structure shown in FIG. 6. Next, as shown in FIG. 11, exposed portions of the back oxide layer 18 and hard mask 28 are removed so as to expose the bottom Si-containing layer and the gate conductor.

Figure 12:
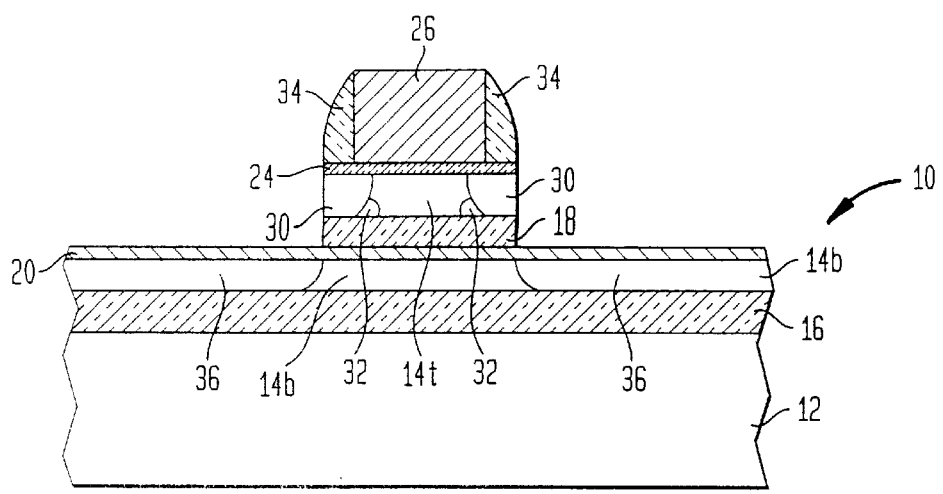

FIG. 12 shows the structure after source/drain regions 36 are formed in the exposed portion of the bottom Si-containing layer. The source and drain regions are formed utilizing the same techniques as mentioned hereinabove.

Figure 13:
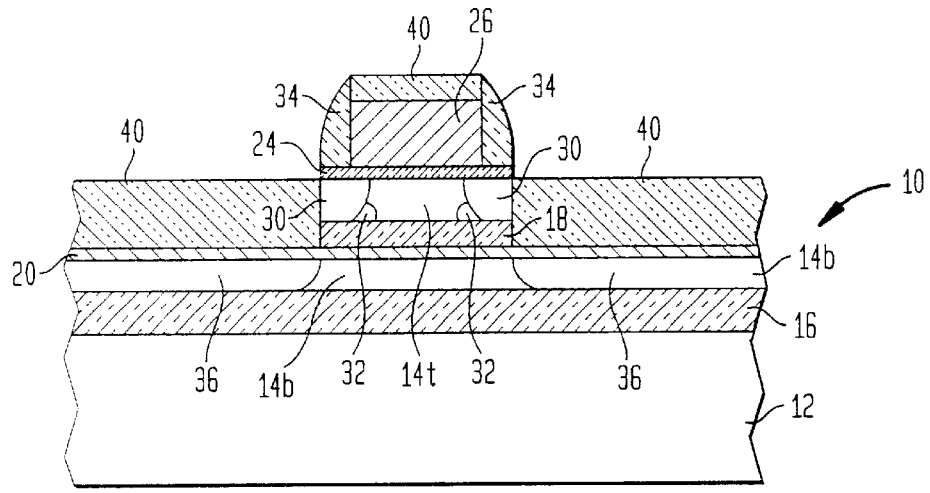

FIG. 13 shows the structure that is obtained after deposition of a Co or Ti layer on the exposed portions of the bottom Si-containing layer and annealing of the metal layer so as to form salicide regions 40. The metal layer is formed by conventional deposition processes and salicidation occurs using the conditions mentioned above.

Figure 14:
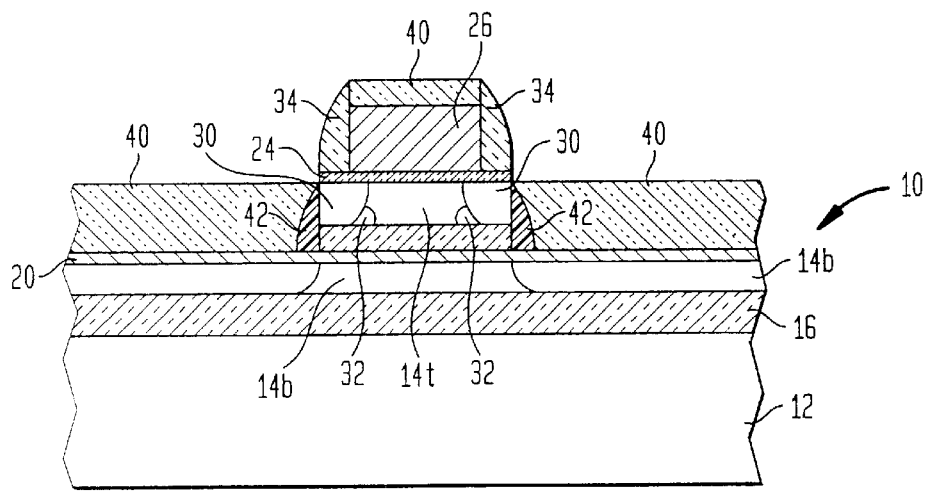
FIG. 14 shows another alternative embodiment of the first method of the present invention.

FIG. 14 show an optional step of the present invention wherein polysilicon spacers 42 are formed about the exposed vertical sidewalls of the etched back oxide layer, the etched top Si-containing layer and the gate dielectric layer. The polysilicon spacers are formed by conventional processes, including deposition and etching.

Figure 15:
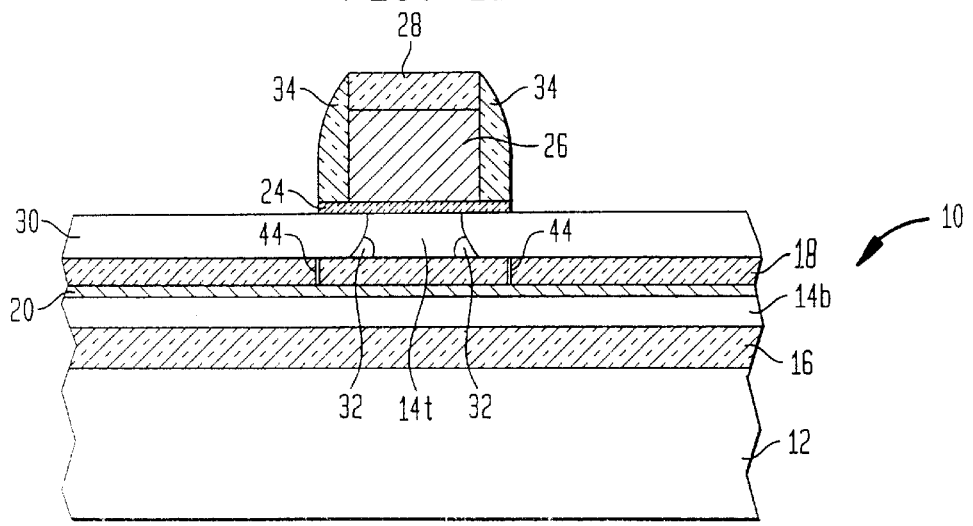
FIGS. 15–17 show the processing steps of the second method of the present invention.
Figure 16:
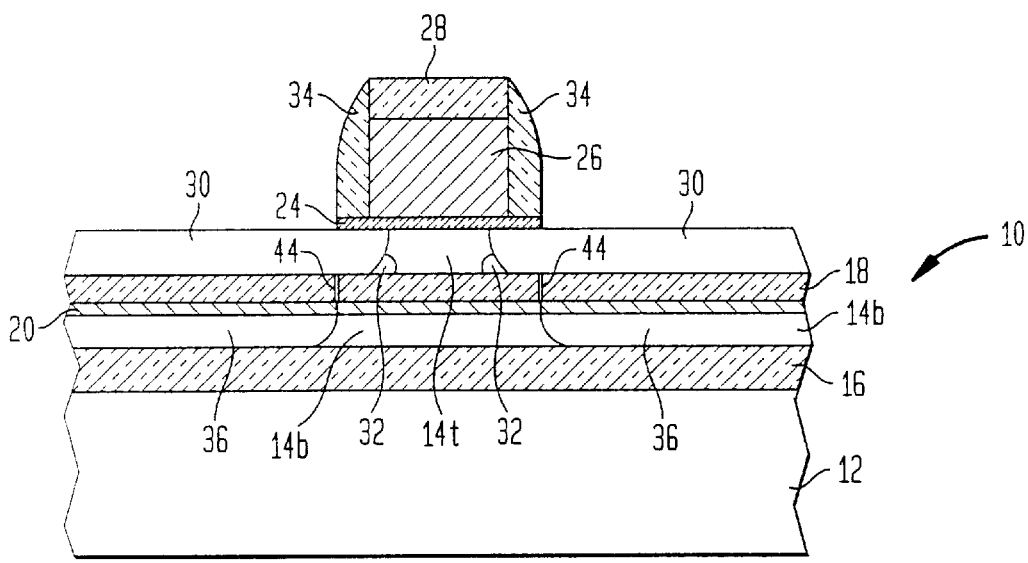
Figure 17:
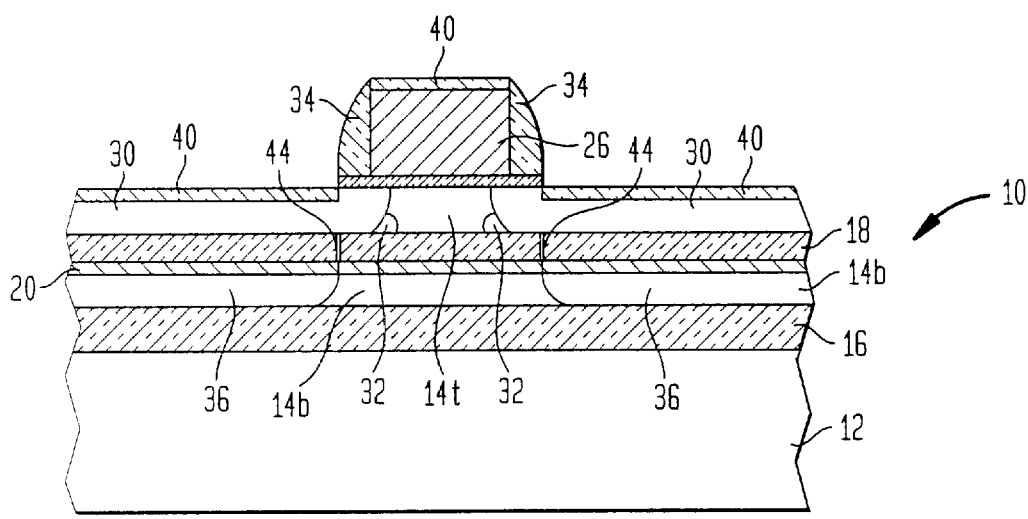

FIGS. 15–17 shows the second method of the present invention. Specifically, the second method of the present invention includes the processing steps which lead to the formation of the structure shown in FIG. 5. Next, as shown in FIG. 15, contact regions 44 are formed by conducting a self-aligned ion implantation process (Ge or As) into regions next to the gate and the spacers. As shown in FIG. 15, the contact regions form a contact to the bottom Si-containing layer.

In an optional step of the second method, a selective epi layer, not shown, may be formed on the top Si-containing layer prior to forming source/drain regions 36. Conventional processes well known to those skilled in the art are employed in forming the optional epi layer.

Source/drain regions 36 are then formed in the bottom Si-containing layer utilizing conventional ion implantation and annealing, see FIG. 16. After removing the hard mask 28 from the structure, salicide regions 40 are then formed, as described above, providing the structure shown in FIG. 17.

It is noted that the above processing steps described and illustrated by FIGS. 1–17 are related to methods in which no damascene processing steps are employed. The present invention may however include a damascene technique in providing a structure having a back oxide region present beneath the gate region of the FET. This aspect of the present invention will now be described in greater detail by referring to the discussion that appears hereinbelow.

Figure 18:
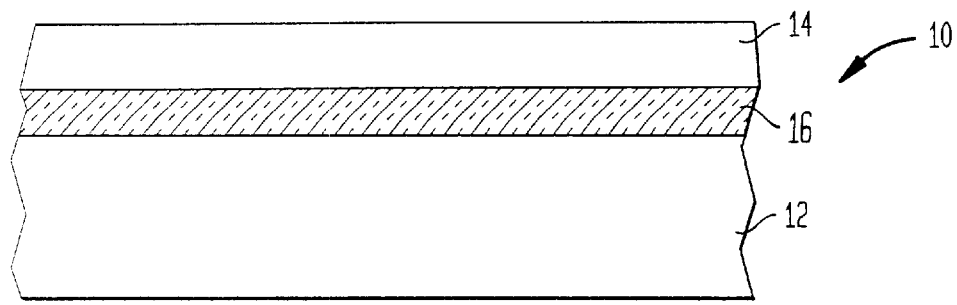
FIGS. 18–23 show the processing steps of the third method of the present invention.

Specifically, FIG. 18 shows the initial structure used in the damascene embodiment of the present invention. The initial structure includes a SOI wafer 10 which includes Si substrate 12, buried oxide layer 16 and Si-containing layer 14. The various techniques mentioned above in forming SOI wafer 10 apply here for this aspect of the-present invention.

Figure 19:
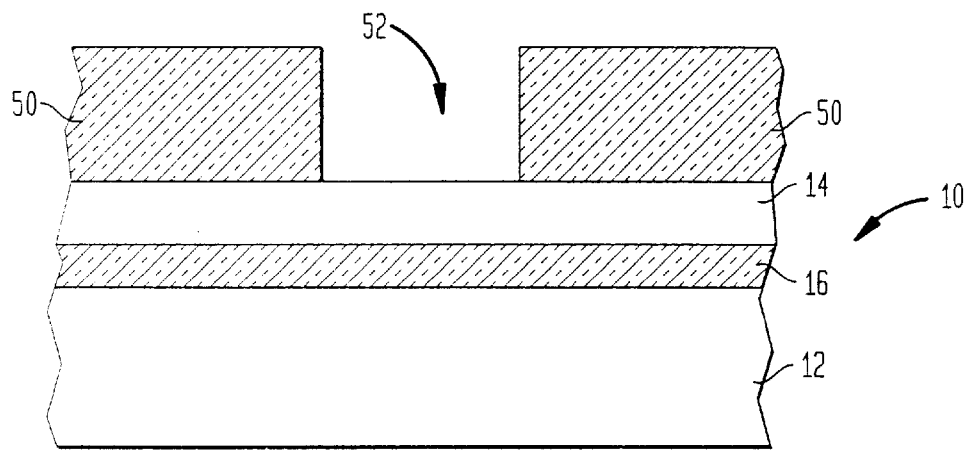

Next, damascene oxide layer 50 is formed on the surface of Si-containing layer 14 by utilizing a conventional deposition process or by thermal growing. Lithography and etching are then employed in forming opening 52 in the damascene oxide layer stopping on the Si-containing layer so as to form the structure shown in FIG. 19. It is noted that opening 52 is the area in which the gate region will be subsequently formed.

Figure 20:
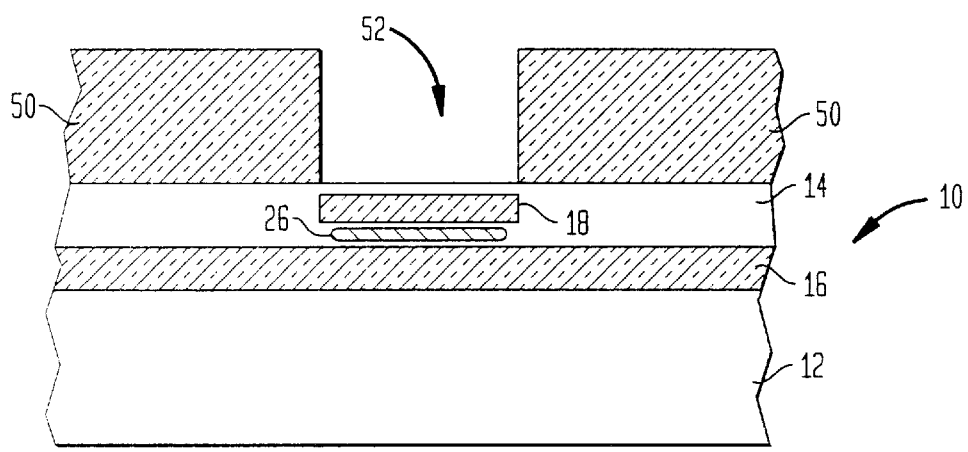

A local back oxide region 18 is then formed in Si-containing layer 14 by $O_2$ implantation (and annealing) though opening 52, and a local ground-plane region 20 is formed beneath the local back oxide region utilizing the ion implantation conditions mentioned hereinabove. The structure formed after these two implant steps is shown in FIG. 20.

Figure 21:
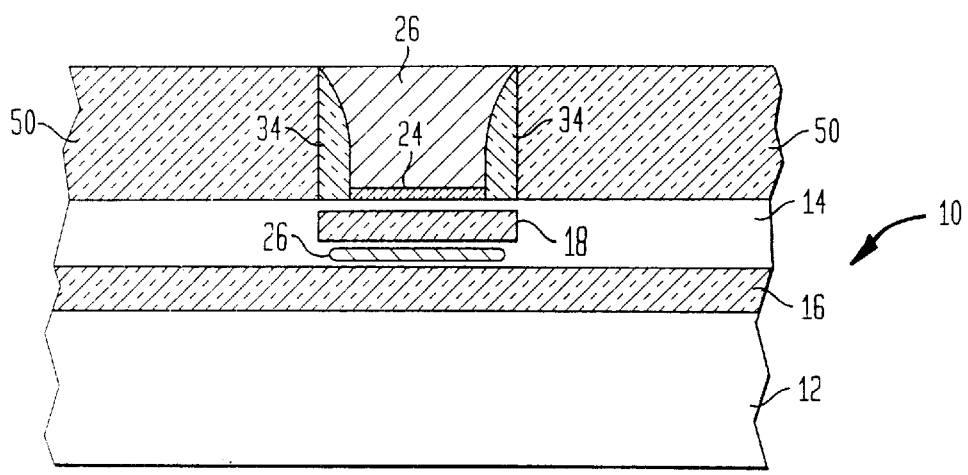

Next, spacers 34 are formed in the opening as describe above, and gate dielectric 24 is formed on the exposed surface of Si-containing layer 14. The opening is then filled with gate conductor 26 and planarized down to damascene oxide layer 50, See FIG. 21. It should be noted that in this aspect of the present invention, spacers 34 are optional and need not be employed. Spacers 34 are however preferably used since the presence of the same in the opening reduces the gate length.

Figure 22:
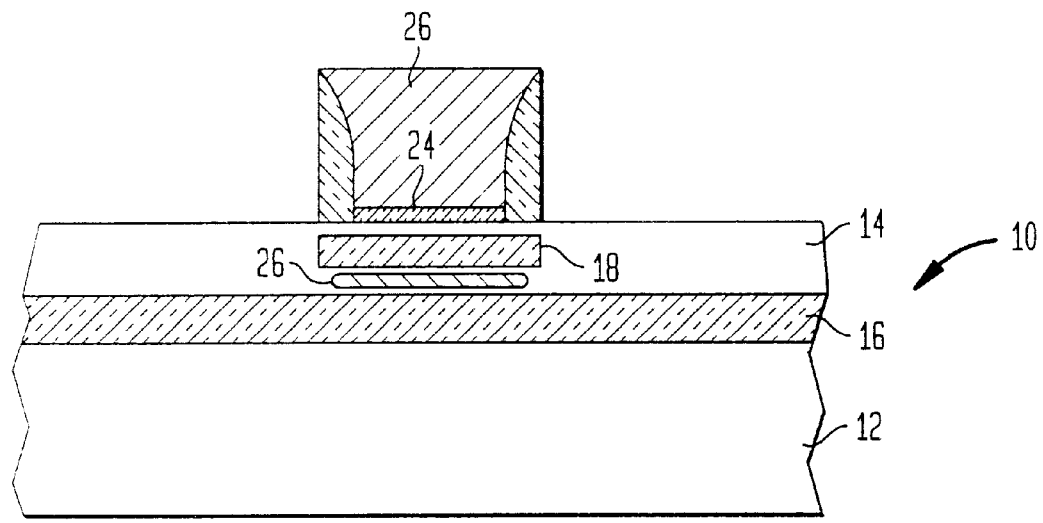

After forming the gate region, the damascene oxide layer is removed by a conventional anisotropic etching process so as to form the structure shown in FIG. 22.

Figure 23:
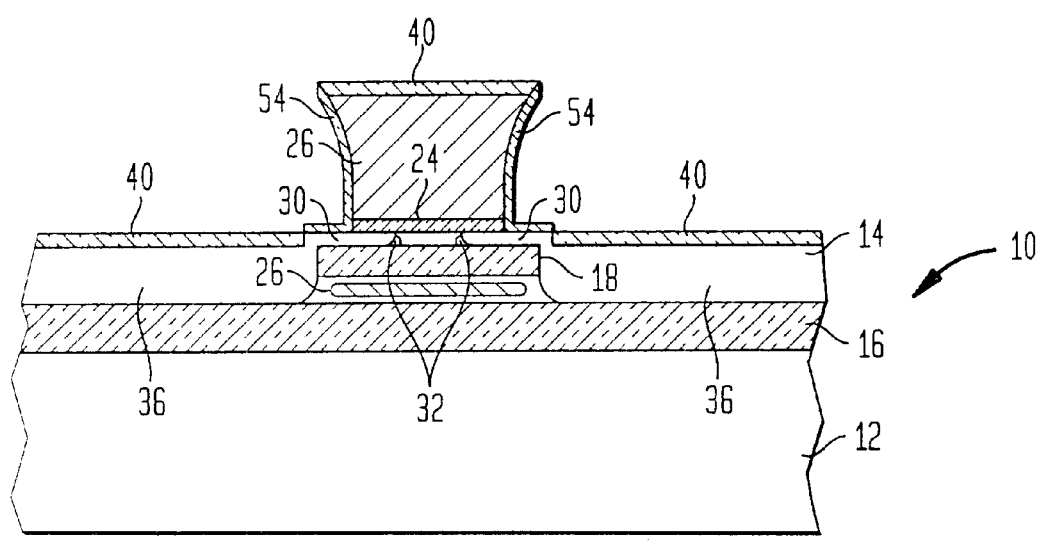

Next, deep source/drain regions 36 are formed in the Si-containing layer using the techniques previously described, the structure is then subjected to a conventional oxidation step and extension implant regions 30 and halo implant regions 32 are formed by angle implantation processes and annealing. Spacers 34 are thereafter removed by conventional etching processes, and a conformal liner 54 (nitride or oxide) is formed by conventional techniques on the sidewalls of the gate region previously occupied by spacers 34. Salicide regions 40 are formed on the exposed horizontal surfaces of the gate conductor and the Si-containing layer utilizing the conditions mentioned above. The final structure obtained from the damascene process is shown in FIG. 23.

Not withstanding which of the various methods of the present invention are employed, the methods provide a ground-plane SOI device in which an oxide region, i.e., back oxide layer 18, is present beneath the gate region of the structure, in an area in between deep source/drain regions 36, (thus double SOI device). The oxide region is further characterized as being abutted against the shallow extension regions (therefore, no shallow extension area junction capacitance) and laterally adjacent to the deep source/drain regions (therefore, reducing the deep source/drain perimeter junction capacitance). Moreover, the benefits of regular SOI devices are maintained (therefore, no deep source/drain area junction capacitance due to the buried oxide beneath the deep source/drain regions). Additionally, no dopants are able to diffuse into the channel region of the device because of the presence of the ground-plane region.

While this invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the spirit and scope of the appended claims.

Having thus described our invention in detail, what we claim is new and desire to secure by the letters patent is:

1. A method of forming a ground-plane SOI device comprising the steps of:
    (a) forming a back oxide layer in a Si-containing layer of a silicon-on-insulator (SOI) wafer so as to separate said Si-containing layer into a top Si-containing layer and a bottom Si-containing layer, said SOI wafer having a buried oxide layer formed on a Si substrate and said Si-containing layer formed on said buried oxide layer;
    (b) forming a ground-plane doping region into a top portion of said bottom Si-containing layer;
    (c) forming a gate region on a portion of said top Si-containing layer, said gate region including a gate dielectric formed on said top Si-containing layer, a gate conductor formed on said gate dielectric and a hard mask formed on said gate conductor;
    (d) forming halo and source/drain extension regions in said top Si-containing layer;
    (e) forming spacers on a portion of said gate dielectric so as to protect vertical sidewalls of said gate conductor and said hard mask;
    (f) removing all exposed portions of said top Si-containing layer so as to expose a portion of said back oxide layer underlying said top Si-containing layer;
    (g) removing said exposed portions of said back oxide layer;
    (h) forming source and drain regions in said bottom Si-containing layer;
    (i) growing Si on all exposed Si surfaces; and
    (j) forming salicide regions on all exposed silicon surfaces.

2. The method of claim 1 wherein said back oxide layer is formed by utilizing $O_2$ implantation at an energy of from about 10 keV to about 50 keV and annealing at a temperature of about 1320° C. or greater.

3. The method of claim 1 wherein ground-plane doping region is formed by ion implantation.

4. The method of claim 1 wherein said gate dielectric is formed by a deposition process selected from the group consisting of chemical vapor deposition (CVD), plasma-assisted CVD, atomic layer chemical vapor deposition, sputtering and chemical solution deposition.

5. The method of claim 1 wherein said gate conductor is formed by a deposition process selected from the group consisting of CVD, plasma-assisted CVD, and sputtering.

6. The method of claim 1 wherein said gate region is patterned by lithography and etching.

7. The method of claim 1 wherein optional spacers are formed about said gate region prior to forming said halo and source/drain extension regions.

8. The method of claim 1 wherein said halo and source/drain extensions are formed by ion implantation processes.

9. The method of claim 1 wherein said spacers of step (e) are formed by deposition and etching.

10. The method of claim 1 wherein step (f) is carried out by an etching process that is selective to said spacers and hard mask.

11. The method of claim 1 wherein step (g) is carried out by an etching process that is selective to nitride and silicon.

12. The method of claim 1 wherein step (g) also removes said hard mask material so as to expose said gate conductor.

13. The method of claim 1 wherein said source and drain regions are formed by ion implantation and annealing.

14. The method of claim 1 wherein said salicide regions are formed by annealing at a temperature of about 700° C. or greater for a time period of about 60 seconds or less.

15. The method of claim 12 wherein said exposed gate conductor is salicided by step (i).

16. The method of claim 1 wherein, prior to saliciding, a selective epitaxially grown Si layer is formed on the bottom-Si containing layer exposed by step (g).

17. The method of claim 1 wherein, prior to saliciding, a metal layer is formed on said bottom Si-containing layer exposed by step (g).

18. The method of claim 17 wherein, prior to forming said metal layer, polysilicon spacers are formed on said bottom Si-containing layer exposed by step (g) so as to protect vertical sidewalls of said back oxide layer, gate dielectric and top Si-containing layer.

19. A method of forming a ground-plane SOI device comprising the steps of:

(a) forming a back oxide layer in a Si-containing layer of a silicon-on-insulator (SOI) wafer so as to separate said Si-containing layer into a top Si-containing layer and a bottom Si-containing layer, said SOI wafer having a buried oxide layer formed on a Si substrate and said Si-containing layer formed on said buried oxide layer;

(b) forming a ground-plane doping region into a top portion of said bottom Si-containing layer;

(c) forming a gate region on a portion of said top Si-containing layer, said gate region including a gate dielectric formed on said top Si-containing layer, a gate conductor formed on said gate dielectric and a hard mask formed on said gate conductor;

(d) forming halo and source/drain extension regions in said top Si-containing layer;

(e) forming spacers on a portion of said gate dielectric so as to protect vertical sidewalls of said gate conductor and said hard mask;

(f) forming a contact to the bottom Si-containing layer by conducting a self-aligned ion implant step into regions next to the gate region and the spacers;

(g) forming source and drain regions in said bottom Si-containing layer;

(h) growing Si on all exposed Si surfaces; and (i) saliciding all exposed silicon surfaces.

20. The method of claim 19 wherein self-aligned ion implantation process includes the use of Ge or As dopants.

21. A method of forming a ground-plane SOI device comprising the steps of:

(a) forming a damascene oxide layer on a surface of a Si-containing layer of an SOI wafer, said SOI wafer including a Si substrate, a buried oxide and said Si-containing layer;

(b) providing an opening in said damascene oxide layer stopping on said Si-containing layer;

(c) forming a local back oxide layer in said Si-containing layer through said opening;

(d) forming a local ground-plane region beneath said local back oxide;

(e) forming a gate region including at least a gate dielectric and a gate conductor in said opening;

(f) removing said damascene oxide layer;

(g) forming source and drain regions in said Si-containing layer of said SOI wafer;

(h) forming extension and halo implant regions in said Si-containing layer above said local back oxide layer;

(i) forming a conformal liner about said gate region; and (j) saliciding all exposed Si surfaces.

22. The method of claim 21 wherein said opening is formed by lithography and etching.

23. The method of claim 21 wherein said conformal layer is formed by a deposition process.

24. The method of claim 21 wherein step (f) includes an anisotropic etching process.

* * * * *